US012672281B2

(12) United States Patent
Howder et al.

(10) Patent No.: US 12,672,281 B2
(45) Date of Patent: Jun. 30, 2026

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Lodestar Licensing Group, LLC

(72) Inventors: Collin Howder, Meridian, ID (US);
Chet E. Carter, Boise, ID (US)

( * ) Notice: Subject to any disclaimer, the term of this patent is extended or adjusted under 35 U.S.C. 154(b) by 412 days.

(21) Appl. No.: 18/389,988

(22) Filed: Dec. 20, 2023

(65) Prior Publication Data

US 2024/0164092 A1    May 16, 2024

Related U.S. Application Data

(60) Continuation of application No. 17/590,052, filed on Feb. 1, 2022, now Pat. No. 11,871,566, which is a division of application No. 16/787,914, filed on Feb. 11, 2020, now Pat. No. 11,276,701.

(51) Int. Cl.
| | |
|---|---|
| *H10B 41/27* | (2023.01) |
| *H10B 41/10* | (2023.01) |
| *H10B 43/10* | (2023.01) |
| *H10B 43/27* | (2023.01) |

(52) U.S. Cl.
CPC ............. *H10B 41/27* (2023.02); *H10B 41/10* (2023.02); *H10B 43/10* (2023.02); *H10B 43/27* (2023.02)

(58) Field of Classification Search
None
See application file for complete search history.

(56) References Cited

U.S. PATENT DOCUMENTS

| | | | |
|---|---|---|---|
| 9,773,922 B1 | 9/2017 | Lin | |
| 10,651,196 B1 * | 5/2020 | Sharangpani | ......... H10B 43/27 |
| 2011/0298013 A1 | 12/2011 | Hwang | |
| 2011/0298037 A1 | 12/2011 | Choe | |
| 2014/0014889 A1 | 1/2014 | Shim | |
| 2014/0239303 A1 | 8/2014 | Zhu | |
| 2015/0132915 A1 | 5/2015 | Park | |
| 2015/0318301 A1 | 11/2015 | Lee | |
| 2016/0093538 A1 | 3/2016 | Wakatsuki | |
| 2016/0240552 A1 | 8/2016 | Arai | |

(Continued)

FOREIGN PATENT DOCUMENTS

| | | |
|---|---|---|
| CN | 103545276 | 1/2014 |
| CN | 103904035 | 7/2014 |

(Continued)

*Primary Examiner* — Sarah K Salerno
(74) *Attorney, Agent, or Firm* — Fletcher Yoder, P.C.

(57) ABSTRACT

A method used in forming a memory array comprising strings of memory cells comprises forming a stack comprising vertically-alternating first tiers and second tiers above a substrate. Horizontally-elongated trenches are formed into the stack to form laterally-spaced memory-block regions. Catalytic material is formed in a bottom region of individual of the trenches. Metal material is electrolessly deposited onto a catalytic surface of the catalytic material to individually fill at least a majority of remaining volume of the individual trenches. Channel-material strings are formed and extend through the first tiers and the second tiers. Other embodiments, including structure independent of method, are disclosed.

20 Claims, 8 Drawing Sheets

(56)          References Cited

U.S. PATENT DOCUMENTS

| | | |
|---|---|---|
| 2016/0268302 A1 | 9/2016 | Lee |
| 2017/0148811 A1 | 5/2017 | Zhang |
| 2017/0207226 A1 | 7/2017 | Lee |
| 2017/0309635 A1 | 10/2017 | Kim |
| 2017/0345843 A1 | 11/2017 | Lee |
| 2019/0198065 A1 | 6/2019 | Russo |
| 2020/0127003 A1 | 4/2020 | Hua |
| 2020/0312868 A1 | 10/2020 | Xiao |

FOREIGN PATENT DOCUMENTS

| | | |
|---|---|---|
| CN | 104637883 | 5/2015 |
| CN | 105047668 | 11/2015 |
| CN | 106992184 | 7/2017 |
| CN | 107305895 | 10/2017 |
| CN | 110114880 | 8/2019 |
| TW | I627733 | 6/2018 |
| WO | 2014130859 | 8/2014 |

* cited by examiner

MEMORY ARRAYS COMPRISING STRINGS OF MEMORY CELLS AND METHODS USED IN FORMING A MEMORY ARRAY COMPRISING STRINGS OF MEMORY CELLS

PRIORITY INFORMATION

This application is a Continuation of U.S. application Ser. No. 17/590,052, filed on Feb. 1, 2022, which is a Divisional Of U.S. application Ser. No. 16/787,914, filed on Feb. 11, 2020, now issued as U.S. Pat. No. 11,276,701 on Mar. 15, 2022, the contents of which are incorporated herein by reference.

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Figure 1:
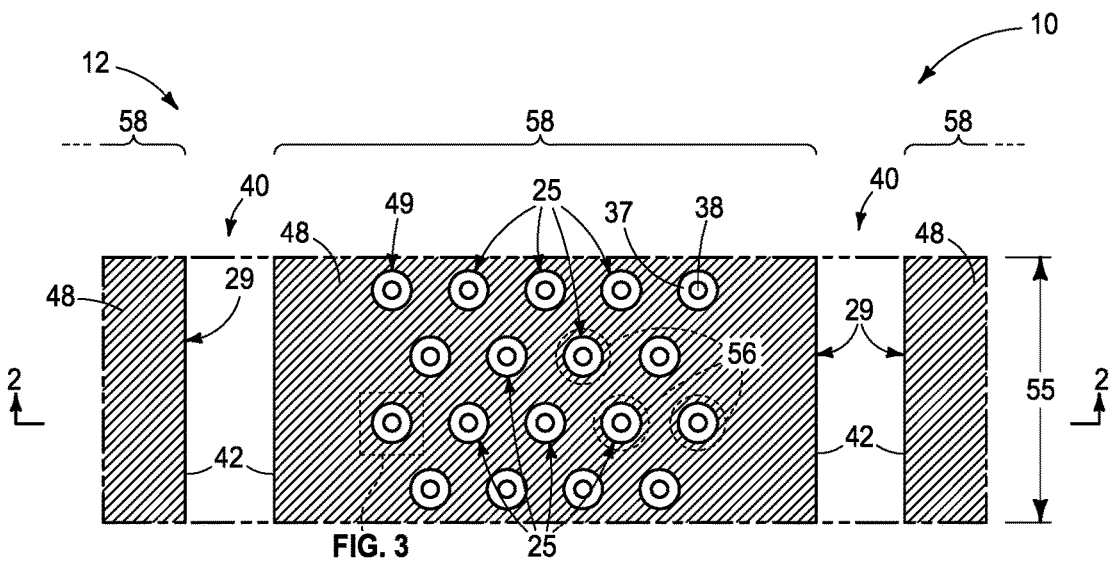
FIG. 1 is a diagrammatic cross-sectional view of a portion of a substrate in process in accordance with an embodiment of the invention and is taken through line 1-1 in FIG. 2.
Figure 2:
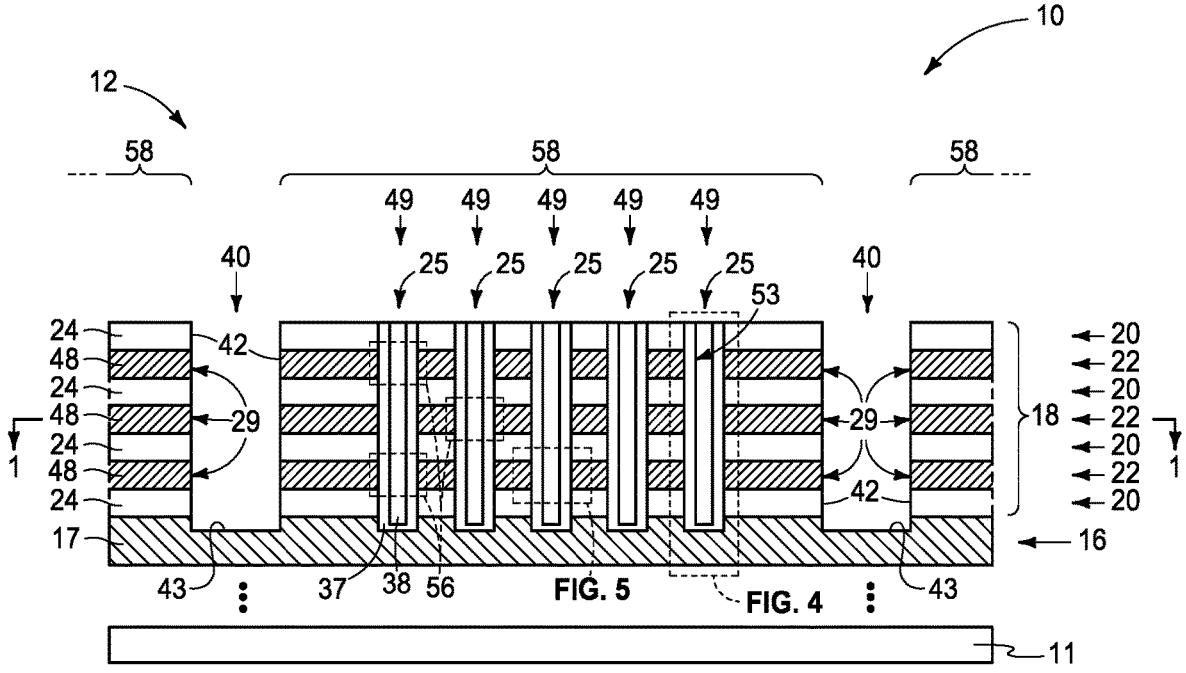
FIG. 2 is a diagrammatic cross-sectional view taken through line 2-2 in FIG. 1.
Figure 3:
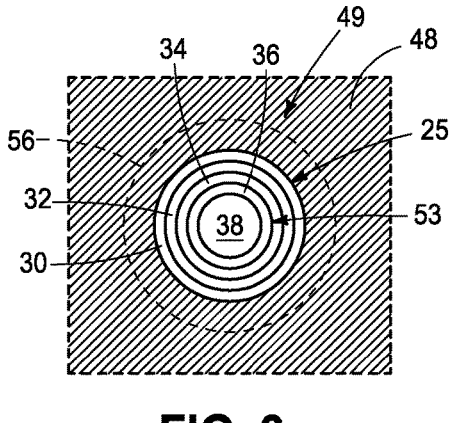
FIGS. 3-5 are enlarged views of portions of FIGS. 1 and 2.
Figure 4:
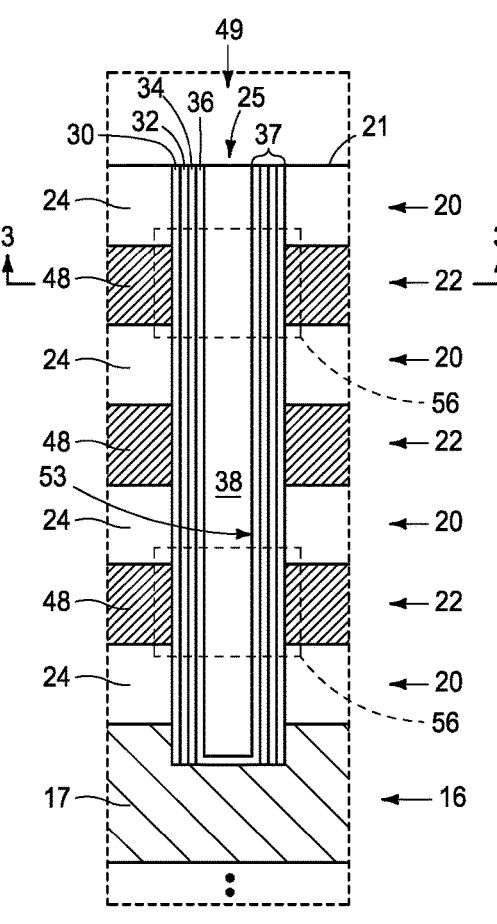
Figure 5:
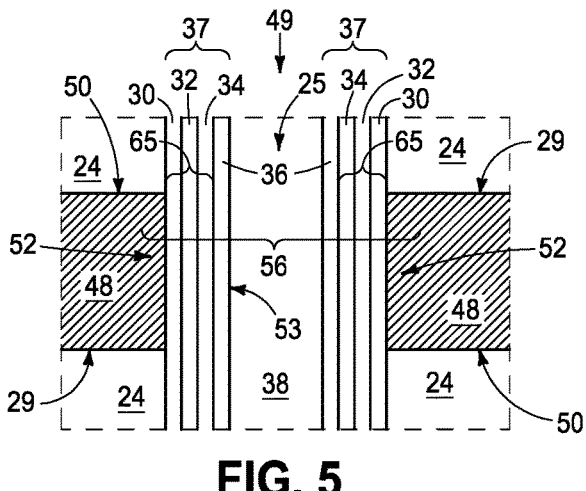

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. Example method embodiments are described with reference to FIGS. 1-16.

FIGS. 1-5 show an example construction 10 having an array area 12 in which elevationally-extending strings 49 of transistors and/or memory cells 56 have been formed. Such includes a base substrate 11 having any one or more of conductive/conductor/conducting, semi conductive/semi conductor/semi conducting, or insulative/insulator/insulating (i.e., electrically herein) materials. Various materials have been formed elevationally over base substrate 11. Materials may be aside, elevationally inward, or elevationally outward of the FIGS. 1-5-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating conductive tiers 22 (alternately referred to as first tiers) and insulative tiers 20 (alternately referred to as second tiers) and has been formed above conductor tier 16. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22 (not shown). Alternately or additionally, at least one of the depicted uppermost and lowest conductive tiers 22 may be a select gate tier. Example insulative tiers 20 comprise insulative material 24 (e.g., silicon dioxide and/or other material that may be of one or more composition(s)).

Channel openings 25 have been formed (e.g., by etching) through insulative tiers 20 and conductive tiers 22 to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so when such a connection is desired. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory-block regions 58 that comprise laterally-spaced memory blocks 58. In this document, "block" is generic to include "sub-block". Memory blocks 58 may be considered as being longitudinally elongated and oriented, for example along a direction 55. Any alternate existing or future-developed arrangement and construction may be used.

Example memory blocks 58 are shown as at least in part having been defined by horizontally-elongated trenches 40 that were formed (e.g., by anisotropic etching) into stack 18. Horizontally-elongated trenches 40 may have respective bottoms that are directly against conductor material 17 (e.g., atop or within) of conductor tier 16 (as shown) or may have respective bottoms that are above conductor material 17 of conductor tier 16 (not shown). Regardless, trenches 40 may be considered as comprising sidewalls 42 and a bottom 43, including a bottom region 35.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 1-5 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18.

Channel material 36 has also been formed in channel openings 25 elevationally along insulative tiers 20 and conductive tiers 22 and comprise individual operative channel-material strings 53 in one embodiment having memory-cell materials (e.g., 30, 32, and 34) there-along and with material 24 in insulative tiers 20 being horizontally-between immediately-adjacent channel-material strings 53. Materials 30, 32, 34, and 36 are collectively shown as and only designated as material 37 in FIGS. 1 and 2 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Regardless, and in one embodiment, conducting material (e.g., a conductive plug/via comprising conductively-doped polysilicon, and not shown) may be directly against laterally-inner sides in an upper portion of individual channel-material strings 53.

Example conductive tiers 22 comprise conducting material 48 that is part of individual conductive lines 29 (e.g., wordlines) that are also part of elevationally-extending strings 49 of individual transistors and/or memory cells 56. A thin insulative liner (e.g., Al₂O₃ and not shown) may be formed before forming conducting material 48. Approximate locations of transistors and/or memory cells 56 are indicated with a bracket in FIG. 5 and some with dashed outlines in FIGS. 1-4, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 5) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36.

In one embodiment, the first tiers are initially formed to comprise sacrificial material that is isotropically etched away and replaced with conducting material 48 of individual conductive lines (e.g., through trenches 40 in a gate-last process, and before an act of electrolessly depositing metal material as described below). Alternately, and by way of example only, trenches 40 can be formed through conducting material 48 (e.g., in a gate-first process).

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separatecomposition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Figure 6:
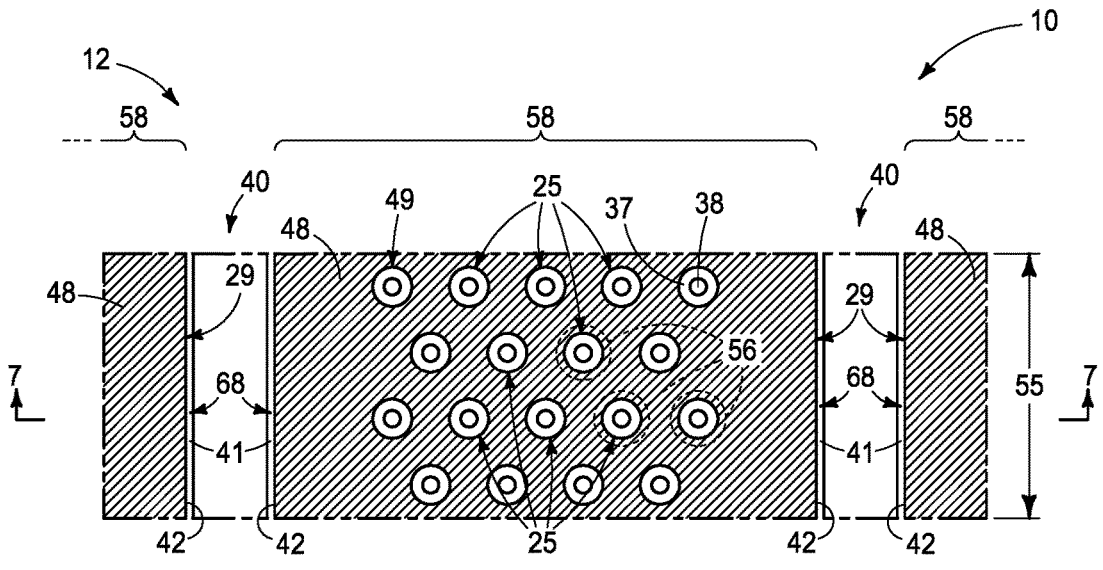
FIGS. 6-16 are diagrammatic sequential sectional, expanded, enlarged, and/or partial views of the construction of FIGS. 1-5, or portions thereof, in process in accordance with some embodiments of the invention.
Figure 7:
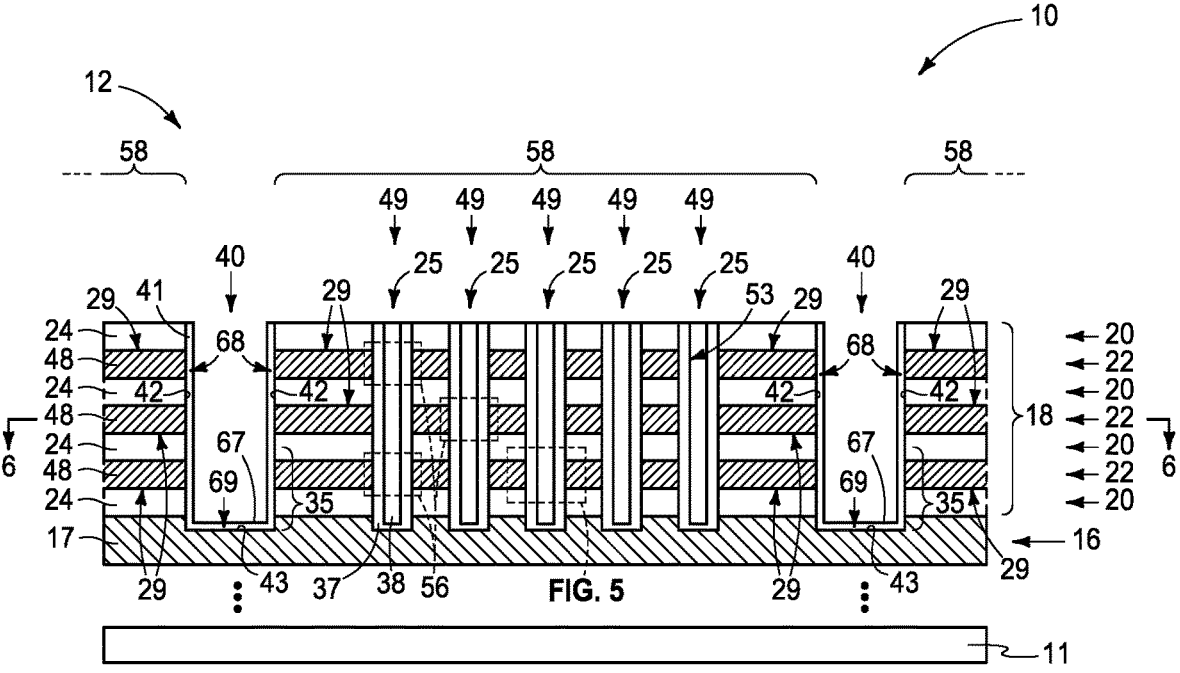

Referring to FIGS. 6 and 7, and in one embodiment, insulating material 41 (e.g., silicon dioxide and/or silicon nitride) has been deposited to line sidewalls 42 and bottom 43 of individual trenches 40 and to less-than-fill individual trenches 40. In one embodiment, insulating material 41 may be considered as having a top surface 67 in the bottom of individual trenches 40 that is angled from sidewalls 42 of individual trenches 40. Conducting material 48 may be laterally recessed back from edges of material 24 in insulative tiers 20 (not shown) and, if so, insulating material 41 would be in recesses formed thereby (not shown).

Figure 8:
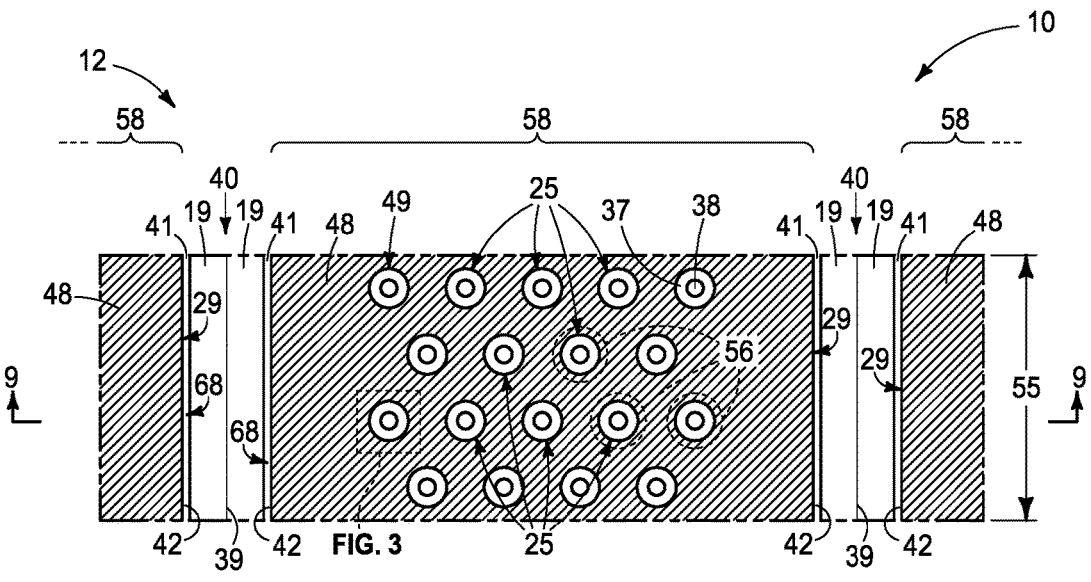
Figure 9:
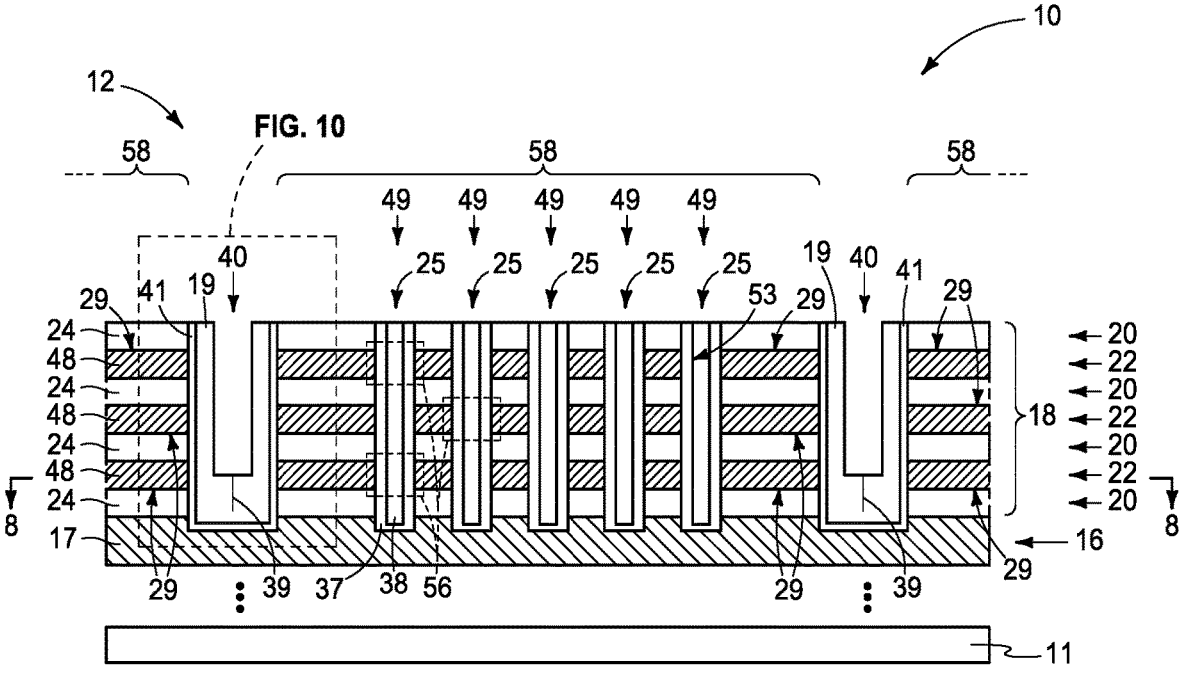
Figure 10:
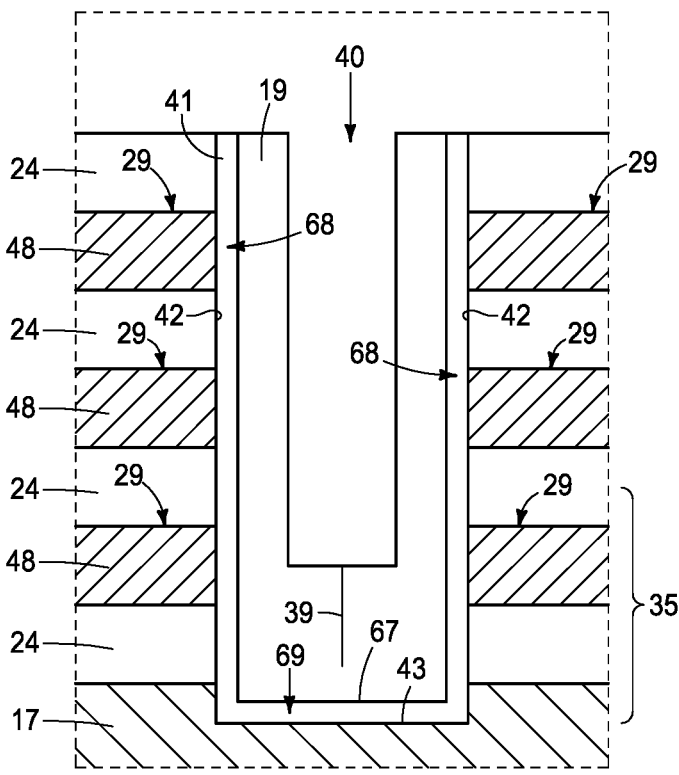

Catalytic material is formed in the bottom region of the individual trenches (i.e., "catalytic" and "non-catalytic" herein being in the context of electroless deposition). By way of example only, FIGS. 8-10 show forming catalytic material 19 atop insulating material 41 in bottom region 35 (FIG. 10) of individual trenches 40, and in one embodiment as shown to line sidewalls 68 and a bottom 69 of insulating material 41 within individual trenches to less-than-fill remaining volume of individual trenches 40. In one embodiment and as shown, catalytic material 19 has been formed to completely cover all of top surface 67 of insulating material 41 in the bottom of individual trenches 40. In one embodiment and as shown, catalytic material 19 has been formed to comprise a vertically-elongated seam 39 therein. In one embodiment and as shown, vertically-elongated seam 39 is also horizontally-elongated (e.g., as shown in FIG. 8). Example catalytic materials include at least one of Ti, Ni, W, Co, Cu, Mo, Au, and Pd.

Figure 11:
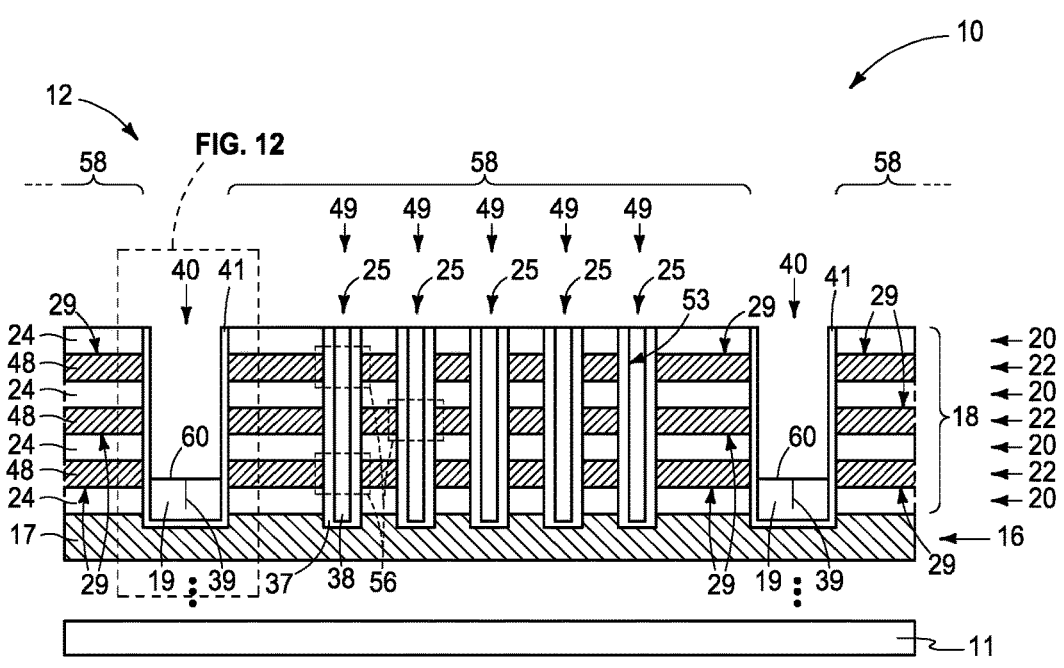
Figure 12:
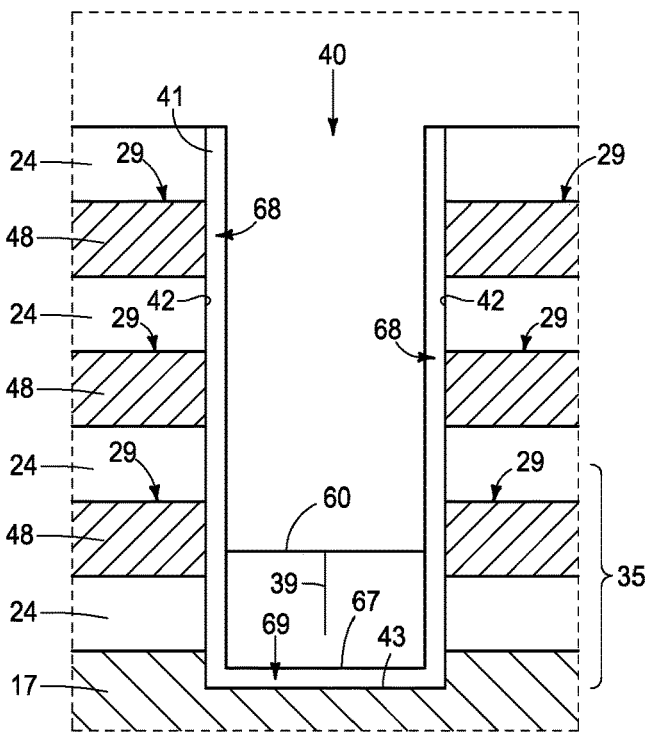

Referring to FIGS. 11 and 12, and in one embodiment, catalytic material 19 has been removed (e.g., by etching) from being over upper portions of trench sidewalls 42, for example leaving catalytic material 19 with an example seam 39 in bottom regions 35 of trenches 40. Catalytic material 19 may be considered as comprising an exposed catalytic surface 60.

Figure 13:
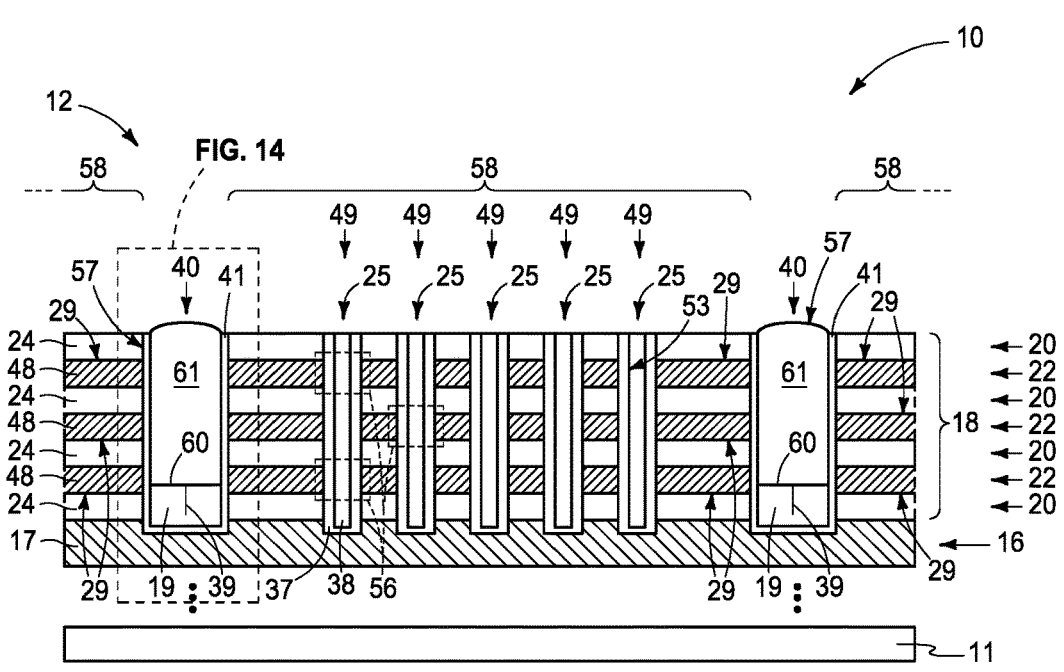
Figure 14:
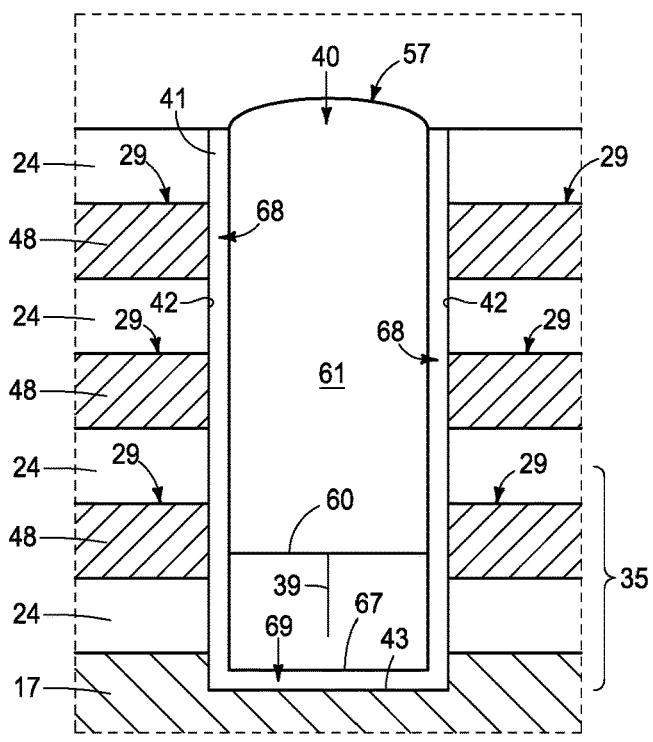

Referring to FIGS. 13 and 14, metal material 61 has been electrolessly deposited onto catalytic surface 60 of catalytic material 19 to individually fill at least a majority of all remaining volume of individual trenches 40. In one embodiment and as shown, such electroless depositing completely fills, and in one embodiment as shown overfills, all remaining volume of individual trenches 40 with electrolessly-deposited metal material 61. In one embodiment, electrolessly-deposited metal material 61 comprises material of the same composition as that of catalytic material 19 and catalytic surface 60. In one such embodiment, the electrolessly-deposited metal material is more than 70% by weight of the same composition as that of catalytic material 19 and catalytic surface 60, and in one such embodiment less than 100% by weight of the same composition as that of catalytic material 19 and catalytic surface 60. In one such latter embodiment, electrolessly-deposited metal material 61 has at least one alloy component in greater concentration than such at least one alloy component, if any, in the catalytic material and catalytic surface, with such alloy component comprising a metal element and a non-metal element. The catalytic material may not contain any of the alloy component (i.e., 0% by weight). In one embodiment, the non-metal element comprises at least one of P, O, S, C, or B, with some specific examples being at least one of CoWP, NiWP, NiB, WP, WB, WCuP, WReP, NiCuP, NiReP, CoP, CoB, FeMoWB, NiCoP, FeSnB, FeWB, FeMoB, NiSnCuP, WSn-CuP, CoWO, NiWO, WCuO, WReO, NiCuO, NiReO, FeMoWO, NiCoO, FeSnO, FeWO, FeMoO, NiSnCuO, WSnCuO, CoWS, NiWS, WCuS, WReS, NiCuS, NiReS, FeMoWS, NiCoS, FeSnS, FeWS, FeMoS, NiSnCuS, WSn-CuS, CoWC, NiWC, WCuC, WReS, NiCuC, NiReC, FeMoWC, NiCoC, FeSnC, FeWC, FeMoC, NiSnCuC, and WSnCuC. Such at least one alloy component may be an impurity/artifact/byproduct introduced by the electroless deposition.

In another embodiment, electrolessly-deposited metal material 61 may be at least 70% by weight of different composition from that of catalytic material 19 and catalytic surface 60.

Regardless, and by way of examples only, example electrolessly-deposited metal materials 61 include a majority by weight of at least one of Ti, W, Mo, Au, Pt, Pd, Co, Cu, and Ni.

In one embodiment and as shown, electrolessly-deposited metal material 61 is devoid of any vertically-elongated seam therein.

The artisan is capable of determining and using any existing or future-developed electroless deposition for forming metal material 61. For example, and by way of examples only, copper can be electrolessly deposited onto copper (the catalytic surface in this example) using an aqueous solution at pH 12.5 containing cupric sulfate, ethylenediaminetetraacetic acid, formaldehyde, and sodium hydroxide. Nickel can be electrolessly deposited onto nickel (the catalytic surface in this example) using an aqueous solution at pH 7.0 containing nickel sulfate, sodium citrate, lactic acid, dimethylamine borane, and ammonium hydroxide. Co(P) can be electrolessly deposited onto a suitable catalytic surface using an aqueous solution at pH 8.0 containing sulfamic acid, sodium sulfate, boric acid, sodium hydroxide, cobalt sulfate, and sodium hypophosphate.

Materials 41, 19, and 61 may collectively be considered as intervening material 57 that may provide lateral electrical isolation (insulation) between immediately-laterally-adjacent memory-blocks 58. Intervening material 57 may include through array vias (TAV's) and not shown.

Figure 15:
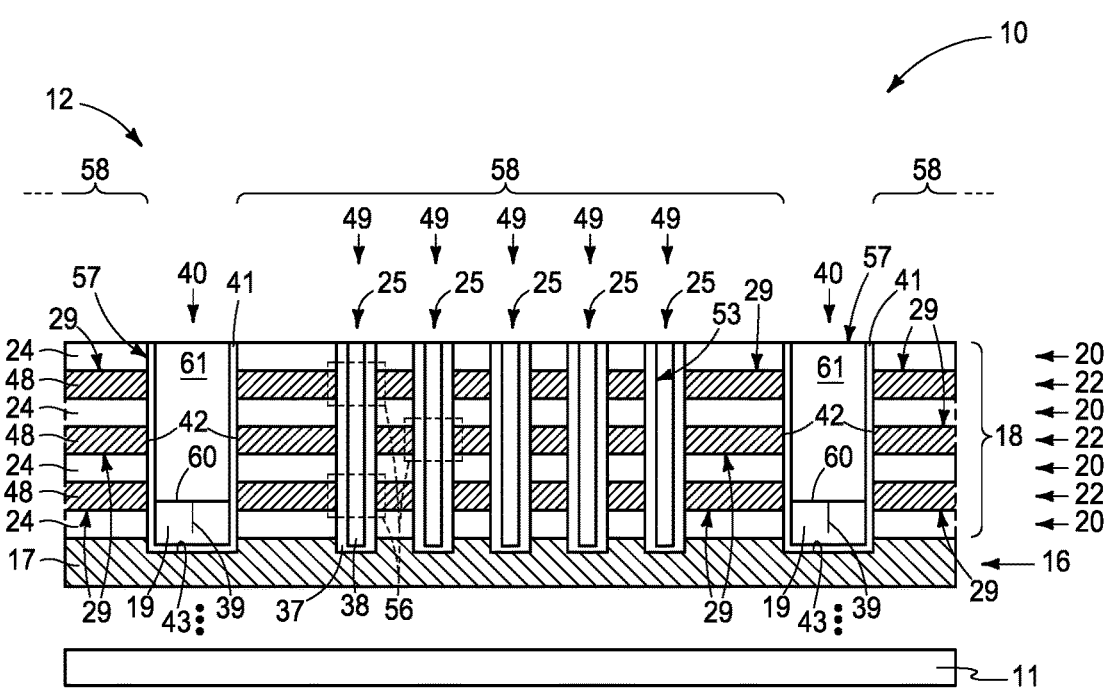
Figure 16:
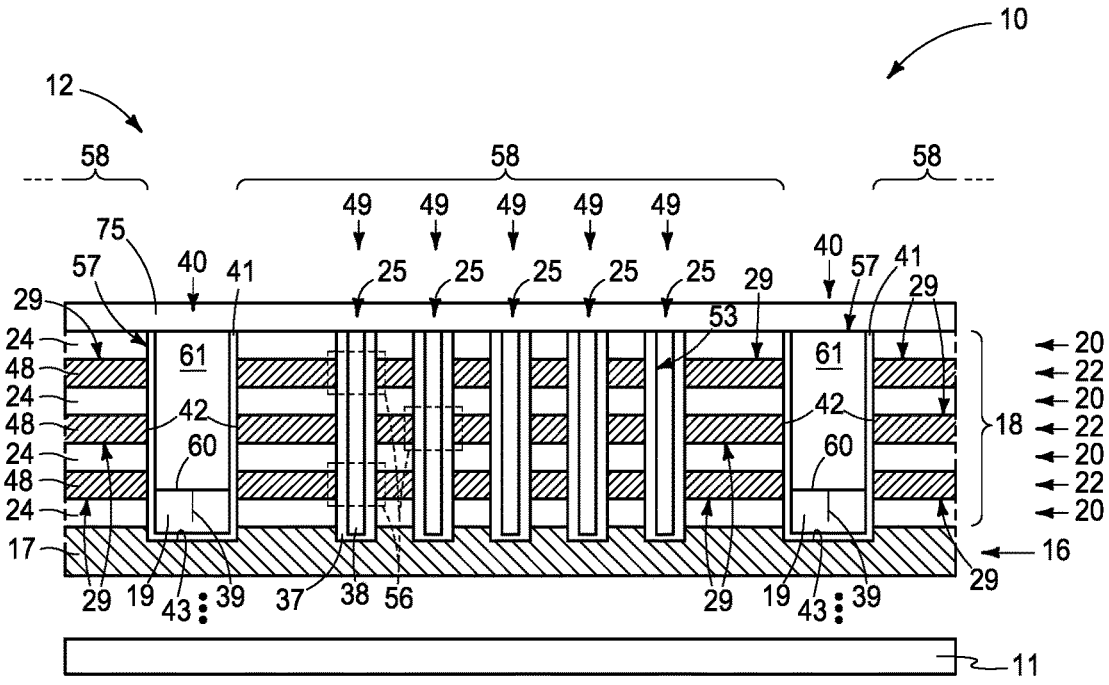

Referring to FIG. 15, an optional planarizing polish has been conducted of electrolessly-deposited metal material 61 as shown. FIG. 16 shows optional subsequent deposition of insulating material 75 (e.g., silicon dioxide and/or silicon nitride).

Any other attribute(s) or aspect(s) as shown and/or described herein with respect to other embodiments may be used in the embodiments shown and described with reference to the above embodiments.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprises strings (e.g., 49) of memory cells (e.g., 56). The array comprises laterally-spaced memory blocks (e.g., 58) individually comprising a vertical stack (e.g., 18) comprising alternating insulative tiers (e.g., 20) and conductive tiers (e.g., 22). Channel-material strings (e.g., 53) of memory cells (e.g., 56) extend through the insulative tiers and the conductive tiers. Intervening material (e.g., 57) is laterally-between and longitudinally-alongside immediately-laterally-adjacent memory blocks 58. The intervening material comprises an upper metal material (e.g., 61) directly above and directly against a lower metal material (e.g., 19). The lower metal material comprises a vertically-elongated seam (e.g., 39) therein. The upper metal material is devoid of any vertically-elongated seam therein. Any other attribute(s) or aspect(s) as shown and/or described herein with respect to other embodiments may be used.

In some embodiments, a memory array (e.g., 12) comprises strings (e.g., 49) of memory cells (e.g., 56). The array comprises laterally-spaced memory blocks (e.g., 58) individually comprising a vertical stack (e.g., 18) comprising alternating insulative tiers (e.g., 20) and conductive tiers (e.g., 22). Channel-material strings (e.g., 53) of memory cells (e.g., 56) extend through the insulative tiers and the conductive tiers. Intervening material (e.g., 57) is laterally-between and longitudinally-alongside immediately-laterally-adjacent memory blocks 58. The intervening material comprises an upper metal material (e.g., 61) directly above and directly against a lower metal material (e.g., 19). The upper and lower metal materials are more than 70% to less than 100% by weight of same composition relative one another. The upper metal material has at least one alloy component in greater concentration than such at least one alloy component, if any, in the lower metal material, with the alloy component comprising a metal element and a non-metal element. In one embodiment, the non-metal element is at least one of P, O, S, C, and B. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a stack comprising vertically-alternating first tiers and second tiers above a substrate. Horizontally-elongated trenches are formed into the stack to form laterally-spaced memory-block regions. Catalytic material is formed in a bottom region of individual of the trenches. Metal material is electrolessly deposited onto a catalytic surface of the catalytic material to individually fill at least a majority of remaining volume of the individual trenches. Channel-material strings are formed and extend through the first tiers and the second tiers.

In some embodiments, the electrolessly-deposited metal material has at least one alloy component in greater concentration than such at least one alloy component, if any, in the catalytic material and catalytic surface. The alloy component comprises a metal element and a non-metal element. In some embodiments, the non-metal element is at least one of P, O, S, C, or B. In some embodiments the non-metal element is P. In some embodiments the non-metal element is O. In some embodiments, the non-metal element is S. In some embodiments, the non-metal element is C. In some embodiments the non-metal element is B.

In some embodiments, the one alloy component comprises at least one of CoWP, NiWP, NiB, WP, WB, WCuP, WReP, NiCuP, NiReP, CoP, CoB, FeMoWB, NiCoP, FeSnB, FeWB, FeMoB, NiSnCuP, WSnCuP, CoWO, NiWO, WCuO, WReO. NiCuO, NiReO, FeMoWO, NiCoO, FeSnO, FeWO, FeMoO, NiSnCuO, WSnCuO, CoWS, NiWS, WCuS, WReS, NiCuS, NiReS, FeMoWS, NiCoS, FeSnS, FeWS, FeMoS, NiSnCuS, WSnCuS, CoWC, NiWC, WCuC, WReS, NiCuC, NiReC, FeMoWC, NiCoC, FeSnC, FeWC, FeMoC, NiSnCuC, and WSnCuC. In some embodiments, the one alloy component comprises CoWP. In some embodiments, the one alloy component comprises NiWP. In some embodiments, the one alloy component comprises NiB. In some embodiments, the one alloy component comprises WP. In some embodiments, the one alloy component comprises WB. In some embodiments, the one alloy component comprises WCuP. In some embodiments, the one alloy component comprises WReP. In some embodiments, the one alloy component comprises NiCuP. In some embodiments, the one alloy component comprises NiReP. In some embodiments, the one alloy component comprises CoP. In some embodiments, the one alloy component comprises CoB. In some embodiments, the one alloy component comprises FeMoWB. In some embodiments, the one alloy component comprises NiCoP. In some embodiments, the one alloy component comprises FeSnB. In some embodiments, the one alloy component comprises FeWB. In some embodiments, the one alloy component comprises FeMoB. In some embodiments, the one alloy component comprises NiSnCuP. In some embodiments, the one alloy component comprises WSnCuP. In some embodiments, the one alloy component comprises CoWO. In some embodiments, the one alloy component comprises NiWO. In some embodiments, the one alloy component comprises WCuO. In some embodiments, the one alloy component comprises WReO. In some embodiments, the one alloy component comprises NiCuO. In some embodiments, the one alloy component comprises NiReO. In some embodiments, the one alloy component comprises FeMoWO. In some embodiments, the one alloy component comprises NiCoO. In some embodiments, the one alloy component comprises FeSnO. In some embodiments, the one alloy component comprises FeWO. In some embodiments, the one alloy component comprises FeMoO. In some embodiments, the one alloy component comprises NiSnCuO. In some embodiments, the one alloy component comprises WSnCuO. In some embodiments, the one alloy component comprises CoWS. In some embodiments, the one alloy component comprises NiWS. In some embodiments, the one alloy component comprises WCuS. In some embodiments, the one alloy component comprises WReS. In some embodiments, the one alloy component comprises NiCuS. In some embodiments, the one alloy component comprises NiReS. In some embodiments, the one alloy component comprises FeMoWS. In some embodiments, the one alloy component comprises NiCoS. In some embodiments, the one alloy component comprises FeSnS. In some embodiments, the one alloy component comprises FeWS. In some embodiments, the one alloy component comprises FeMoS. In some embodiments, the one alloy component comprises NiSnCuS. In some embodiments, the one alloy component comprises WSnCuS. In some embodiments, the one alloy component comprises CoWC. In some embodiments, the one alloy component comprises NiWC. In some embodiments, the one alloy component comprises WCuC. In some embodiments, the one alloy component comprises WReS. In some embodiments, the one alloy component comprises NiCuC. In some embodiments, the one alloy component comprises NiReC. In some embodiments, the one alloy component comprises FeMoWC. In some embodiments, the one alloy component comprises NiCoC. In some embodiments, the one alloy component comprises FeSnC. In some embodiments, the one alloy component comprises FeWC. In some embodiments, the one alloy component comprises FeMoC. In some embodiments, the one alloy component comprises NiSnCuC. In some embodiments, the one alloy component comprises WSnCuC.

In some embodiments, a method used in forming a memory array comprising strings of memory cells comprises forming a stack comprising vertically-alternating insulative and conductive tiers. The stack comprises laterally-spaced memory blocks having horizontally-elongated trenches there-between. Channel-material strings extend through the insulative tiers and the conductive tiers. Insulating material is deposited to line sidewalls and a bottom of individual of the trenches and to less-than-fill the individual trenches. Catalytic material is formed atop the insulating material in a bottom region of the individual trenches. Metal material is electrolessly deposited onto a catalytic surface of the catalytic material to individually fill at least a majority of remaining volume of the individual trenches.

In some embodiments, a memory array comprising strings of memory cells comprises laterally-spaced memory blocks individually comprising a vertical stack comprising alternating insulative tiers and conductive tiers. Channel-material strings of memory cells extend through the insulative tiers and the conductive tiers. Intervening material is laterally-between and longitudinally-alongside immediately-laterally-adjacent of the memory blocks. The intervening material comprises an upper metal material directly above and directly against a lower metal material. The lower metal material comprises a vertically-elongated seam therein. The upper metal material is devoid of any vertically-elongated seam therein.

In some embodiments, the lower metal material comprises at least one of Ti, Ni, W, Co, Cu, Mo, Au, and Pd. In some embodiments, the lower metal material comprises Ti. In some embodiments, the lower metal material comprises Ni. In some embodiments, the lower metal material comprises W. In some embodiments, the lower metal material comprises Co. In some embodiments, the lower metal material comprises Cu. In some embodiments, the lower metal material comprises Mo. In some embodiments, the lower metal material comprises Au. In some embodiments, the lower metal material comprises Pd.

In some embodiments, the upper metal material comprises at least one of Ti, W, Mo, Au, Pt, Pd, Co, Cu, and Ni. In some embodiments, the upper metal material comprises Ti. In some embodiments, the upper metal material comprises W. In some embodiments, the upper metal material comprises Mo. In some embodiments, the upper metal material comprises Au. In some embodiments, the upper metal material comprises Pt. In some embodiments, the upper metal material comprises Pd. In some embodiments, the upper metal material comprises Co. In some embodiments, the upper metal material comprises Cu. In some embodiments, the upper metal material comprises Ni.

In some embodiments, a memory array comprising strings of memory cells comprises laterally-spaced memory blocks individually comprising a vertical stack comprising alternating insulative tiers and conductive tiers. Channel-material strings of memory cells extend through the insulative tiers and the conductive tiers. Intervening material is laterally-between and longitudinally-alongside immediately-laterally-adjacent of the memory blocks. The intervening material comprises an upper metal material directly above and directly against a lower metal material. The upper and lower metal materials are more than 70% to less than 100% by weight of the same composition relative one another. The upper metal material has at least one alloy component in greater concentration than such at least one alloy component, if any, in the lower metal material. The alloy component comprises a metal element and a non-metal element.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising strings of memory cells, comprising:
    horizontally-elongated trenches in a stack forming laterally-spaced memory-block regions;
    a catalytic material in a bottom region of individual trenches of the horizontally-elongated trenches, wherein the catalytic material comprises:
        laterally-outer sidewalls between which the catalytic material laterally-continuously extends in the bottom region of the trenches; and
        a vertically-elongated seam therein that is laterally between the laterally-outer sidewalls and below a catalytic surface of the catalytic material; and
    metal material directly above the catalytic surface of the catalytic material to substantially fill remaining volume of the trenches.

2. The memory device of claim 1, wherein the metal material completely fills the remaining volume of the trenches.

3. The memory device of claim 1, wherein the metal material overfills the remaining volume of the trenches with an electrolessly-deposited metal material having at least one alloy component in greater concentration than an alloy component in the catalytic material and catalytic surface.

4. The memory device of claim 1, wherein the metal material comprises material of the same composition as that of the catalytic material.

5. The memory device of claim 1, wherein the metal material is more than 70% by weight of the same composition as that of the catalytic material and the catalytic surface.

6. The memory device of claim 1, wherein the vertically-elongated seam is also horizontally-elongated.

7. The memory device of claim 1, wherein the metal material is devoid of a vertically-elongated seam.

8. A memory array comprising strings of memory cells, comprising:
    a stack comprising vertically-alternating insulative and conductive tiers, and comprising:
        laterally-spaced memory blocks having horizontally-elongated trenches there-between; and
        channel-material strings extending through the insulative tiers and the conductive tiers;
    insulating material lining sidewalls and a bottom of individual of the trenches,
        wherein the insulating material does not fill the individual trenches;
    catalytic material formed atop the insulating material in a bottom region of the individual trenches; and
    metal material on a catalytic surface of the catalytic material to individually fill at least a portion of remaining volume of the individual trenches.

9. The memory array of claim 8, wherein the metal material is an electrolessly-deposited metal material having at least one alloy component in greater concentration than an alloy component in the catalytic material and catalytic surface.

10. The memory array of claim 8, wherein:
    the insulating material has a top surface in the bottom of the individual trenches that is angled from the sidewalls of the individual trenches; and
    the catalytic material completely covers the top surface of the insulating material in the bottom of the individual trenches.

11. The memory array of claim 8, comprising the catalytic material lining sidewalls and a bottom of the insulating material within the individual trenches.

12. The memory array of claim 8, wherein the metal material is at least 70 percent by weight of different composition from that of the catalytic material and the catalytic surface.

13. A memory array comprising strings of memory cells, comprising:
    laterally-spaced memory blocks individually comprising a vertical stack having alternating insulative tiers and conductive tiers;
    channel-material strings of memory cells extending through the insulative tiers and the conductive tiers;
    a lower metal material in a bottom region of individual trenches of between the memory blocks, wherein the lower metal material comprises laterally-outer sidewalls between which the lower metal material laterally-continuously extends in the bottom region of the individual trenches; and
    intervening material laterally-between and longitudinally-alongside immediately-laterally-adjacent of the memory blocks, the intervening material comprising an upper metal material directly above and directly against the lower metal material, the lower metal material comprising a vertically-elongated seam therein and below the upper material, the upper metal material being devoid of any vertically-elongated seam therein.

14. The memory array of claim 13, wherein the upper and lower metal materials are more than 70% to less than 100% by weight of the same composition relative one another.

15. The memory array of claim 13, wherein the upper metal material has an alloy component in greater concentration than the component, if any, in the lower metal material.

16. The memory array of claim 15, wherein the alloy component comprises a metal element and a non-metal element.

17. The memory array of claim 13, wherein the lower metal material is a catalytic material.

18. The memory array of claim 13, wherein the lower metal material comprises at least one of Ti, Ni, W, Co, Cu, Mo, Au, and Pd.

19. The memory array of claim 13, wherein the upper metal material and the lower metal material fill a trench in the vertical stack.

20. The memory array of claim 13, wherein the upper metal material and the lower metal material overfill a trench in the vertical stack.

* * * * *